(12) United States Patent
Albert

(10) Patent No.: US 7,697,117 B2
(45) Date of Patent: Apr. 13, 2010

(54) PROVIDING A PATTERN OF POLARIZATION

(75) Inventor: Michael M. Albert, Stamford, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/961,678

(22) Filed: Dec. 20, 2007

(65) Prior Publication Data

US 2008/0094601 A1 Apr. 24, 2008

Related U.S. Application Data

(63) Continuation of application No. 10/852,099, filed on May 25, 2004, now Pat. No. 7,324,280.

(51) Int. Cl.
*G03B 27/58* (2006.01)
(52) U.S. Cl. .......................... 355/71; 355/67; 359/489; 359/497; 359/501
(58) Field of Classification Search .............. 355/67, 355/71; 359/489, 493, 47, 501
See application file for complete search history.

(56) References Cited

U.S. PATENT DOCUMENTS

| | | | |
|---|---|---|---|
| 2,269,713 A | 1/1942 | Erwin | |
| 2,420,252 A | 5/1947 | Land | |
| 3,049,051 A | 8/1962 | Debrie | |
| 5,300,972 A * | 4/1994 | Kamon | ............... 355/71 |
| 5,442,184 A | 8/1995 | Palmer et al. | |
| 5,559,583 A | 9/1996 | Tanabe et al. | |
| 5,673,103 A | 9/1997 | Inoue et al. | |
| 5,677,755 A | 10/1997 | Oshida et al. | |
| 6,045,976 A * | 4/2000 | Haruki et al. | ............... 430/311 |
| 6,055,103 A | 4/2000 | Woodgate | |
| 6,191,880 B1 | 2/2001 | Schuster | |
| 6,239,853 B1 | 5/2001 | Winker et al. | |
| 6,310,679 B1 | 10/2001 | Shiraishi | |
| 6,404,482 B1 | 6/2002 | Shiraishi | |
| 6,420,094 B1 | 7/2002 | Haruki et al. | |
| 6,483,573 B1 * | 11/2002 | Schuster | ............... 355/71 |
| 6,624,862 B1 * | 9/2003 | Hayashi et al. | ............ 349/119 |
| 6,721,258 B1 | 4/2004 | Hashimoto | |
| 7,117,350 B2 | 10/2006 | Harada | |

(Continued)

FOREIGN PATENT DOCUMENTS

EP      0 887 666 A2      12/1998

(Continued)

OTHER PUBLICATIONS

Office Action for Japanese Patent Application No. 2005-152952 mailed Jun. 18, 2008, 7 pgs.

(Continued)

*Primary Examiner*—Hung Henry Nguyen
*Assistant Examiner*—Steven H Whitesell-Gordon
(74) *Attorney, Agent, or Firm*—Sterne, Kessler, Goldstein & Fox P.L.L.C.

(57) ABSTRACT

A polarization pattern assembly produces a polarization pattern. In an embodiment, a polarization pattern assembly includes a frame that supports a polarization pane in a central region of the frame. The polarization pane changes the polarization direction of light incident upon the polarization pane. Different polarization patterns in a pupil of a polarized illuminator can be generated.

22 Claims, 10 Drawing Sheets

U.S. PATENT DOCUMENTS

| | | | |
|---|---|---|---|
| 7,324,280 | B2 | 1/2008 | Albert |
| 2002/0176166 | A1* | 11/2002 | Schuster ............... 359/494 |
| 2006/0158624 | A1 | 7/2006 | Toyoda |
| 2007/0146676 | A1 | 6/2007 | Tanitsu et al. |
| 2008/0130109 | A1 | 6/2008 | Albert et al. |

FOREIGN PATENT DOCUMENTS

| | | |
|---|---|---|
| GB | 856621 A | 12/1960 |
| JP | 6-120110 A | 4/1994 |
| JP | 7-176476 A | 7/1995 |
| JP | 7-307268 A | 11/1995 |
| JP | 9-184918 A | 7/1997 |
| JP | 11084131 A | 3/1999 |
| JP | 11204432 | 7/1999 |
| JP | 2005-242632 A | 9/2005 |
| WO | WO 00/79331 A1 | 12/2000 |
| WO | WO 2006/077849 A1 | 7/2006 |

OTHER PUBLICATIONS

PCT International Preliminary Report on Patentability for International Application No. PCT/EP2005/050981, dated Nov. 29, 2006.

PCT International Search Report for International Application No. PCT/EP2005/050981, dated Jul. 28, 2005.

Schellenberg, F., "A Little Light Magic," IEEE Spectrum 40:34-39, Institute of Electrical and Electronics Engineers (Sep. 2003).

English-Abstract for Japanese Patent Publication No. 11-084131, published Mar. 26, 1999, 1 page, printed from http://v3.espace.com.

Search Report for International Appl. No. SG 200503282-6, 5 pages, dated Jul. 23, 2007.

Search Report for International Appl. No. EP 05010989.1, 4 pages, dated Nov. 17, 2005.

English Abstract for Japanese Patent Publication No. 11-204432, published Jul. 30, 1999, 1 page, printed from http://v3.espace.com.

* cited by examiner

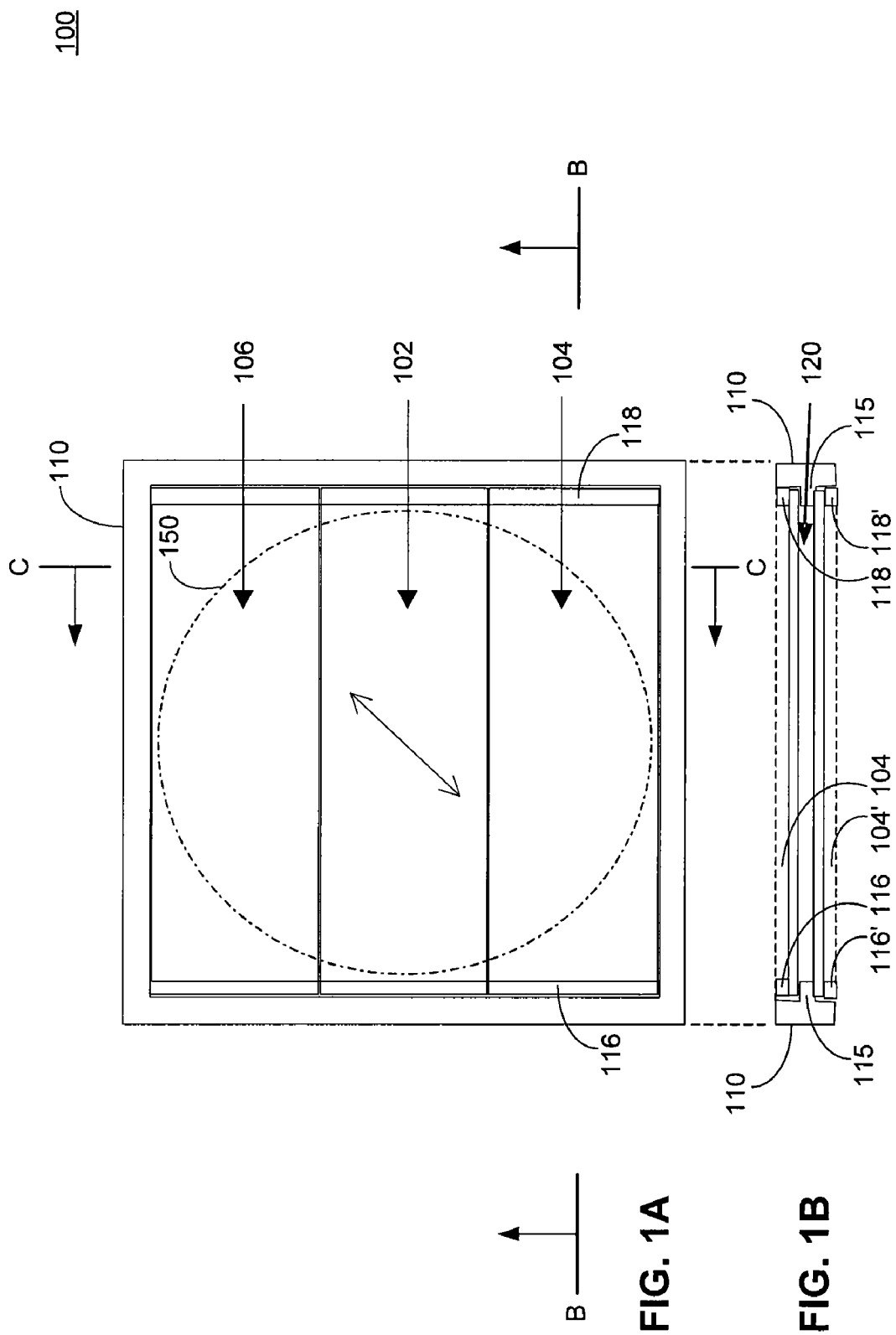

Vertical input polarization

Horizontal input polarization

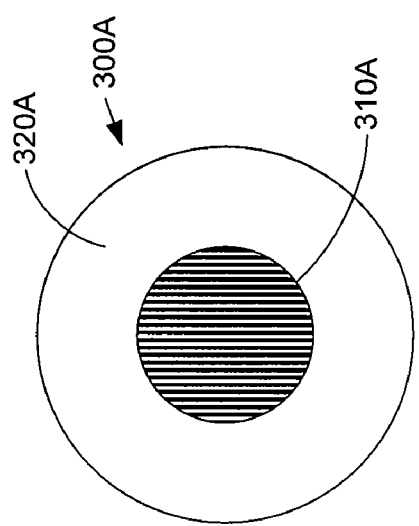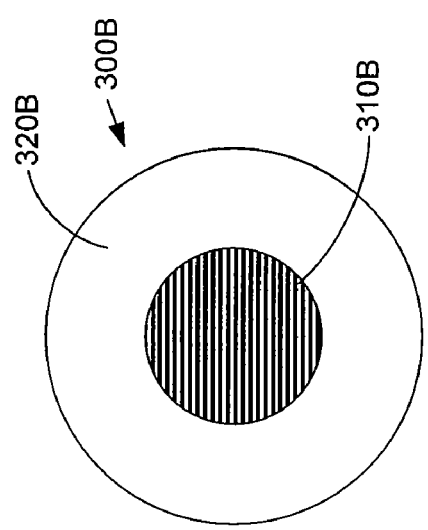
FIG. 3A
FIG. 3B

PROVIDING A PATTERN OF POLARIZATION

BACKGROUND OF THE INVENTION

1. Field of the Invention

The present invention relates to optical systems that provide light beams with polarization that varies along the cross section of the beam.

2. Background Art

In order to create faster and more sophisticated circuitry, the semiconductor industry continually strives to reduce the size of the circuit elements. The circuits are produced primarily by photolithography. In this process, the circuits are printed onto a semiconductor substrate by exposing a coating of radiation sensitive material to light. The radiation sensitive material is often referred to as a "photoresist" or just resist. Passing the light through a mask, which may consist of a pattern of chrome or other opaque material formed on a transparent substrate, generates the desired circuit pattern. The mask may also be formed by a pattern of higher and lower regions etched into the surface of a transparent substrate, or some combination of the two techniques. Subsequent thermal or chemical processing removes only the exposed or only the unexposed regions of the resist (depending on the material) leaving regions of the substrate bare for further processing which in turn produces the electronic circuit.

Projection exposure systems with a higher numerical aperture and shorter exposure wavelength are desired in order to achieve the highest resolutions and decrease the critical dimension (CD) of features being fabricated. Now the polarization of the exposure light at a reticle and at a wafer can have a substantial impact on imaging. For example, polarization at the reticle (or mask) affects the lithographic performance in several ways. First, the interaction of the illumination with features of the reticle, say, for example, dense lines of chrome, can vary with polarization. The transmission and scattering at a mask then depends on the polarization of the light and features of the mask. Second, reflections at the surfaces of lenses and mirrors are polarization dependent so that apodization and to a lesser degree the wave front of the projection optics ("P.O.") depend on polarization. Also, the reflection from the surface of the resist depends on polarization, and this too is effectively a polarization dependent apodization. Finally, the rays diffracted from the reticle that are brought back together at the wafer need to interfere to produce an image (also called vector interference). However, only parallel components of the electric field generally can interfere, so the polarization state of each ray at the wafer affects the coherent imaging.

Accordingly, it is increasingly desirable to provide polarized illumination in lithographic systems. Further, as demand for increased resolution and higher NA systems increases, it is increasingly desirable to control polarization across a pupil. A polarization pattern is needed such that different portions of an exposure beam have different polarizations (i.e., different polarization directions). Desired polarization patterns include radial, tangential or other custom polarization patterns.

Heretofore, creating such polarization patterns has been difficult and expensive. One approach provides a mosaic tile structure made up of many birefringent tiles. Each tile can polarize a corresponding section of an exposure beam in a particular direction. In this way, the mosaic of tiles can create a polarization pattern, such as a radial pattern, across a pupil. See, U.S. Pat. No. 6,191,880. Such a mosaic tile structure, however, uses many tiles to provide the polarization pattern. This mosaic of tiles is complicated and difficult to manufacture. Among other things, a sandwich structure may be needed to hold the individual tiles in place across the width of the exposure beam. This is disadvantageous as differential thermal expansion across the mosaic, especially in natural birefringent crystal material, can prevent optical contact and lead to apodization (i.e. undesired intensity variations) at the pupil.

What is needed is a device that can provide polarization patterns, including radial and tangential patterns, without requiring excessively complicated mechanical structure.

BRIEF SUMMARY OF THE INVENTION

The present invention overcomes the above-mentioned problems and provides further advantages.

The present invention relates to polarization pattern illumination. A polarization pattern assembly produces a polarization pattern. In an embodiment, a polarization pattern assembly includes a frame that supports a polarization pane in a central region of the frame. The polarization pane changes the polarization direction of light incident upon the polarization pane. Different polarization patterns in a pupil of an illuminator can then be generated by illuminating the polarization pattern assembly with linearly polarized light at a horizontal or vertical orientation. These patterns include three-zone hybrid polarization patterns, low sigma linear patterns, radial dipole patterns, tangential dipole patterns, tangential quadrupole patterns, and radial quadrupole patterns.

In a further embodiment, a polarization pattern assembly includes a frame that supports a layer having a polarization pane in a central region of the frame and two non-polarization panes on opposite sides of the polarization pane.

In a further embodiment, a polarization pattern assembly includes a frame that supports two layers of panes separated by a gap in a stack arrangement. Each layer of panes includes a polarization pane in a central region of the frame and two non-polarization panes on opposite sides of the polarization pane. In one example, the polarization panes in the central region form a half wave plate that can rotate the polarization direction of an incident beam 90 degrees.

In a further embodiment, a polarized illuminator for a lithographic system is provided that includes a polarization pattern assembly. The polarization pattern assembly can be provided at or near a pupil plane or in any pupil space within the polarized illuminator.

According to a further feature, one or more beam shapers, such as a diffractive optical element or mask, can be provided on a common optical before or after a polarization pattern assembly. A beam shaper in combination with the polarization pattern assembly can further facilitate the generation of polarization patterns according to the present invention.

An advantage of embodiments of the present invention is that a polarization pattern assembly with a polarization pane can have a relatively simple structure yet is versatile. Such a polarization pattern assembly can produce a variety of polarization patterns by simply rotating the polarization pattern assembly relative to an incident beam, by rotating the direction of polarization of an incident beam, or by adding or modifying a beam shaper.

Further, a polarization pattern assembly with a frame holding polarization panes in a two-layer stack arrangement can accommodate different thermal expansions.

A further advantage is realized for polarized illuminators in lithography as embodiments of the present invention can allow for a variety of polarization patterns at a particular pupil of interest.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1A-1C are diagrams of a polarization pattern assembly according to an embodiment of the present invention. FIG. 1A is a top view of the polarization pattern assembly. FIG. 1B is a first side view of the polarization pattern assembly of FIG. 1A taken along line BB. FIG. 1C is a second side view of the polarization pattern assembly of FIG. 1A taken along line CC.

FIGS. 3A, 3B, 4A, 4B, 5A, 5B, 6A, and 6B illustrate various polarization patterns that can be generated according to embodiments of the present invention.

Figure 7:
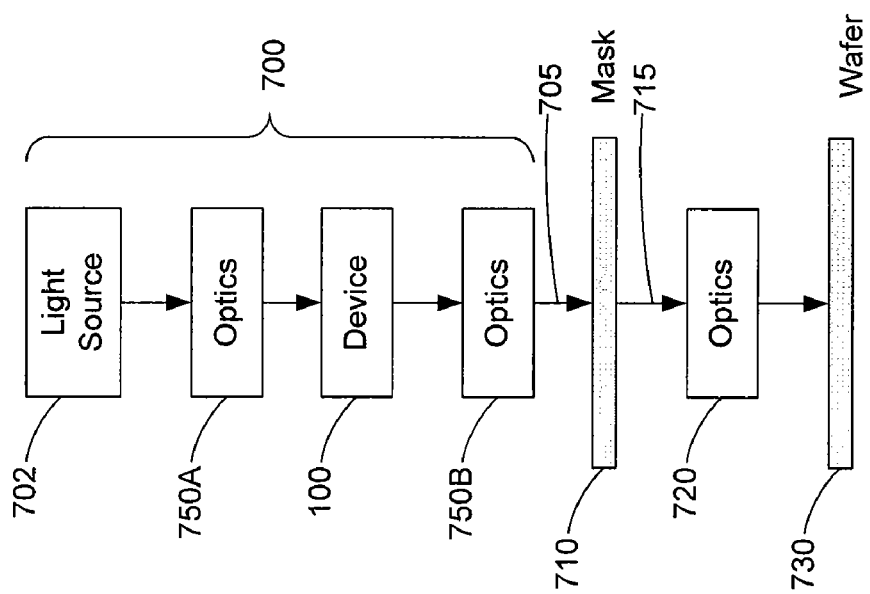

FIG. 7 is a diagram illustrating a polarized illuminator including a polarization pattern assembly in a lithographic system according to an embodiment of the present invention.

DETAILED DESCRIPTION OF THE INVENTION

Reference will now be made to the drawings in which the various elements of the present invention will be given numerical designations and in which the invention will be discussed so as to enable one skilled in the art to make and use the invention.

Figure 1C:
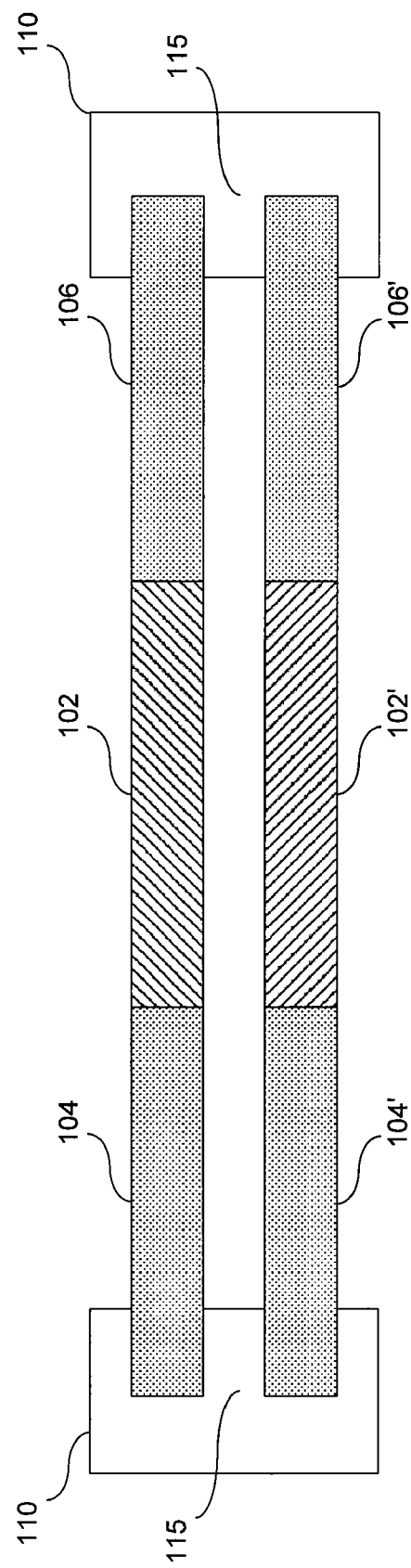

FIGS. 1A-1C are diagrams of a polarization pattern assembly 100 according to an embodiment of the present invention. As shown in FIG. 1A, polarization pattern assembly 100 includes a frame 110 that holds polarization pane 102 in a central region of frame 110. Frame 110 can further hold two non-polarization panes 104 and 106 on opposite sides of polarization pane 102 in a first layer. As shown in FIGS. 1B and 1C, frame 110 can also hold a second layer having a polarization pane 102' in between non-polarization panes 104' and 106' in a stack arrangement below respective panes 102-106 of the first layer.

Polarization panes 102, 102' can rotate the direction of polarization of light incident on the panes. For example, polarization panes 102, 102' can be made of birefringent material, such as quartz or magnesium fluoride ($MgF_2$). In an example, panes 102 and 102' have optical axes crossed and are polished to a net one-half wavelength of an incident beam. In this way, panes 102 and 102' act as a half waveplate to rotate the polarization direction of incident linearly polarized light by 90 degrees. Panes 102 and 102' can be two multi-order waveplates stacked to form a pseudo zero order waveplate, thus reducing thermal sensitivity.

Non-polarization panes 104, 104' and 106, 106' pass light through without significantly changing the direction of polarization. In one example, non-polarization panes 104, 104' and 106, 106' can be made of non-birefringent material, such as fused silica or calcium fluoride ($CaF_2$). In this way, panes 104, 104' and 106, 106' help reduce undesired path length differences between rays traveling through polarization pattern assembly 100. Non-polarization panes 104, 104' and 106, 106' are optional and can be omitted if desired.

As shown in FIG. 1B, frame 110 can include a spacer 115 that separates panes 102-106 and panes 102'-106' by a gap 120. Holding members 118 can also be provided on two side edges of each pane 102-106 and 102'-106' so that a force (clamping, adhesive, etc.) can be applied to hold the panes 102-106, and 102'-106' in position within frame 110. Spacer 115 provides and advantage in that gap 120 can be created and/or adjusted to accommodate for thermal expansion of different materials used in panes 102-106, 102'-106'. Spacer 115 and holding members 116, 116', 118, and 118' are optional and illustrative, and not intended to limit the present invention. Other types of spacers and/or holding members can be used as would be apparent to a person skilled in the art given this description.

In general, frame 110 can be any shape and area suitable for holding panes 102-106 and 102'-106' in accordance with a desired form factor or other design criteria. In an embodiment, panes 102-106 and 102'-106' are rectangular (or square) and frame 110 likewise has a rectangular (or square) shape and an area large enough to hold panes 102-106 and 102'-106' as shown in FIGS. 1A-1C. The present invention is not intended to be so limited and other shapes can be used for panes 102-106 and 102'-106' and frame 110 as would be apparent to a person skilled in the art given this description.

Polarization pattern assembly 100 can be inserted in an optical path of any optical system including, but not limited to, an illuminator having a pupil plane. FIG. 1A further shows an imaging area 150 that can correspond to the area of polarization pattern assembly 100 that falls within a pupil of an optical system (not shown). In the example of FIG. 1A, imaging area 150 has three zones corresponding to respective areas of panes 102-106 and 102'-106'. Since polarization panes 102 and 102' have a different polarization property than non-polarization panes 104, 106 and 104', 106', a polarization pattern will be imparted across a pupil of the optical system.

The operation of polarization assembly 100 including the generation of particular polarization patterns is described further with respect to FIGS. 2-6. Three-zone hybrid polarization patterns can be created. In FIG. 2A, an incident light beam 210 passes through polarization pattern assembly 100 which outputs an output beam 220. Incident light beam 210 can be linearly polarized along an x-axis (also called a horizontal direction). FIG. 2B shows a resultant three-zone hybrid polarization pattern 230 created by polarization pattern assembly 100 when illuminated with an incident light beam 210 that is linearly polarized in a horizontal direction. Pattern 230 includes a center zone 232 in between two outer zones 234, 236. Light in center zone 232 has passed through polarization panes 102, 102' and is now vertically polarized. Light in outer zone 234 has passed through non-polarization panes 104, 104' and remains horizontally polarized. Light in outer zone 236 has passed through non-polarization panes 106, 106' and also remains horizontally polarized.

Figure 2A:
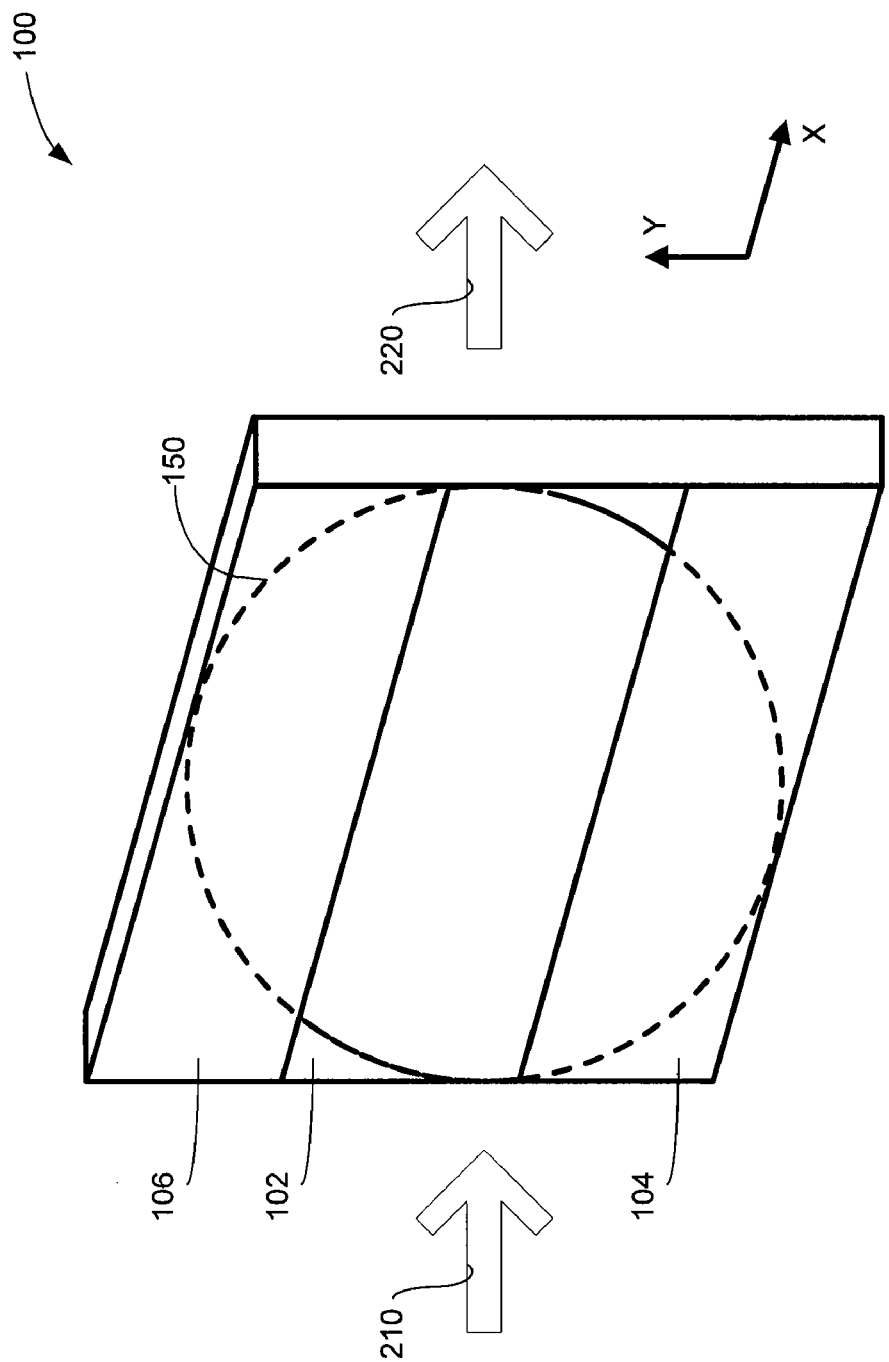
FIG. 2A is a diagram illustrating three zones of polarization created along a cross-section of an incident light beam by a polarization pattern assembly according to an embodiment of the present invention.
Figure 2C:
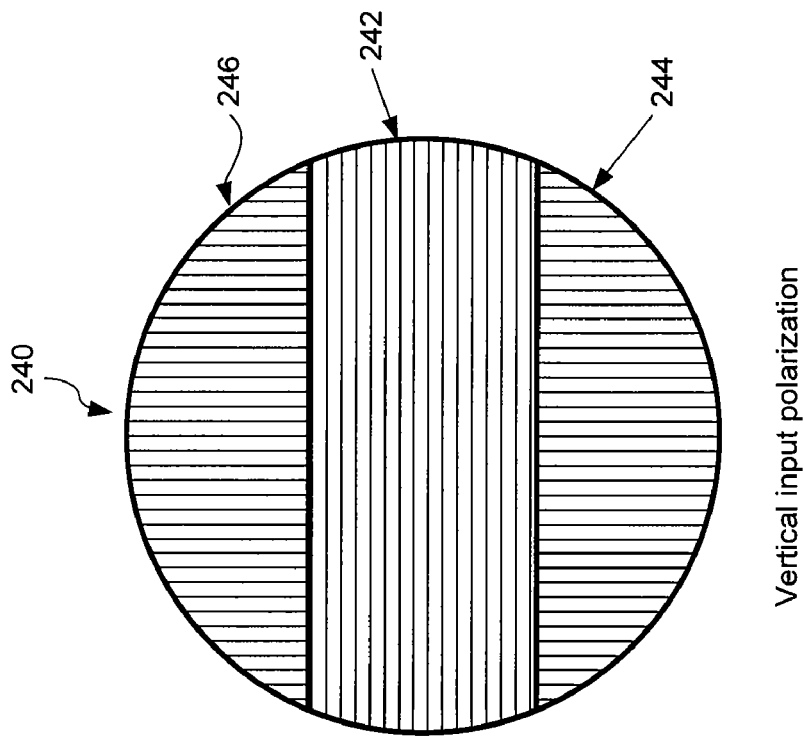
FIG. 2C is a diagram illustrating a three-zone hybrid polarization pattern created by a polarization pattern assembly illuminated with vertically polarized incident light according to an embodiment of the present invention.
Figure 2B:
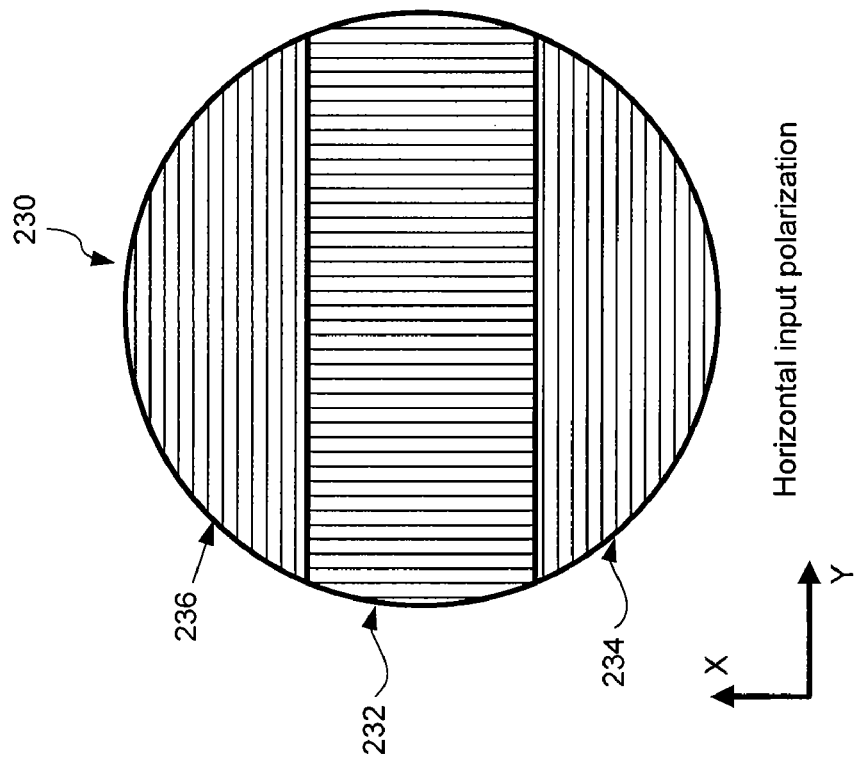
FIG. 2B is a diagram illustrating a three-zone hybrid polarization pattern created by a polarization pattern assembly illuminated with horizontally polarized incident light according to an embodiment of the present invention.

Alternatively, incident light beam 210 can be linearly polarized along a y-axis (also called a vertical direction). FIG. 2C shows a resultant three-zone hybrid polarization pattern 240 created by polarization pattern assembly 100 when illuminated with an incident light beam 210 that is linearly polarized in a vertical direction. Pattern 240 includes a center zone 242 in between two outer zones 244, 246. Light in center zone 242 has passed through polarization panes 102, 102' and is now horizontally polarized. Light in outer zone 244 has passed through non-polarization panes 104, 104' and remains vertically polarized. Light in outer zone 246 has passed through non-polarization panes 106, 106' and also remains vertically polarized.

In this way, an advantage of polarization pattern assembly 100 is that different polarization patterns can be attained simply by inputting horizontally or vertically polarized light. This could be achieved in a number of ways including but not limited to: providing a linear polarizer at a source and rotating the polarizer in a horizontal or vertical orientation relative to polarization pattern assembly 100 and/or rotating polarization pattern assembly 100 relative to a linearly polarized light source.

Figure 2D:
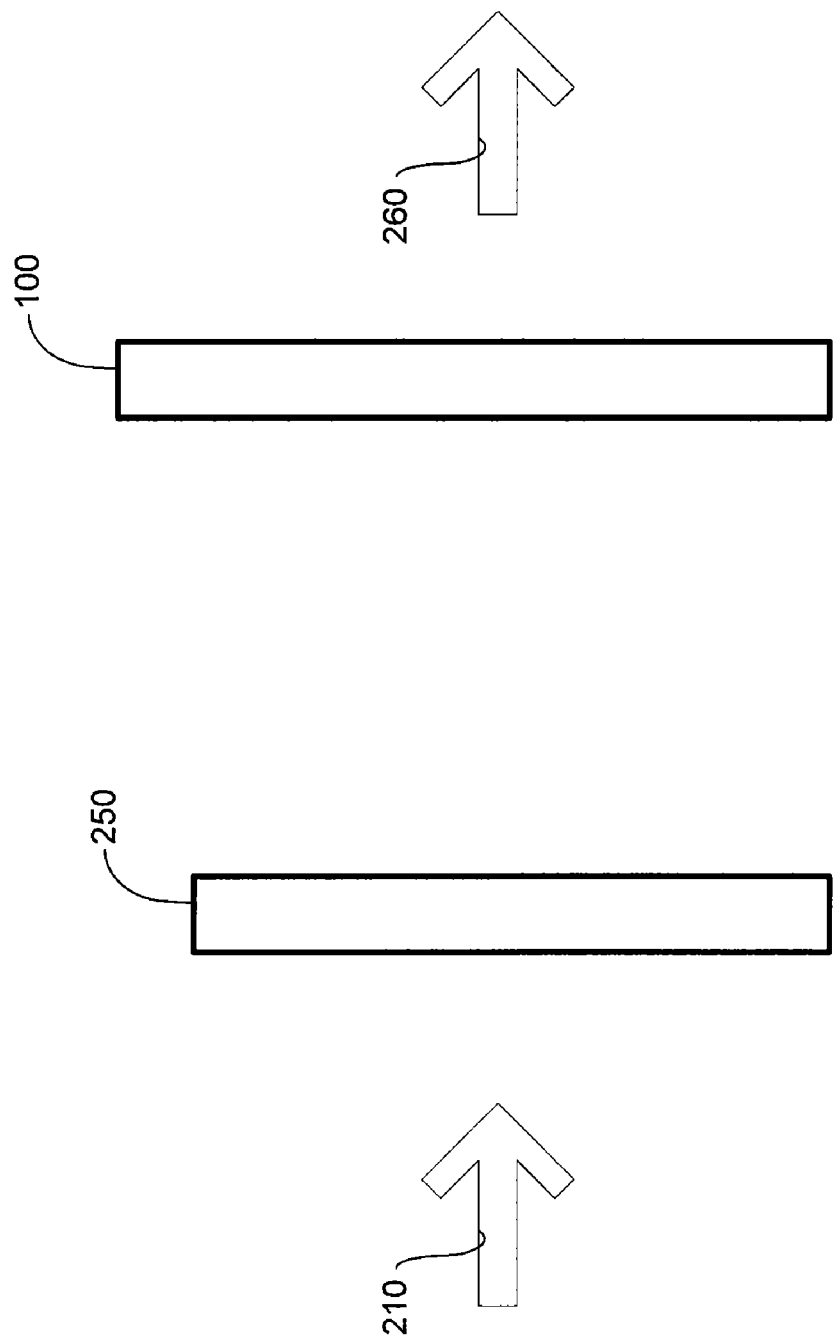
FIG. 2D is a diagram further illustrating a beam shaper in combination with a polarization pattern assembly according to an embodiment of the present invention.

According to a further feature, a beam shaper can also be provided in combination with a polarization pattern assembly to generate additional patterns. FIG. 2D is a diagram illustrating a beam shaper 250 in combination with a polarization pattern assembly 100 according to an embodiment of the present invention. Beam shaper 250 can be a diffractive optic or mask that shapes an incident beam 210 and then passes the shaped beam to polarization pattern assembly 100 which outputs an output beam 260. Alternatively, beam shaper 250 can be provided on the other side of polarization pattern assembly 100 to receive light that has passed through polarization pattern assembly 100. FIGS. 3A, 3B, 4A, 4B, 5A, 5B, 6A, and 6B illustrate additional polarization patterns that can be generated using a beam shaper 250 in combination with polarization pattern assembly 100 according to embodiments of the present invention.

Low sigma linear patterns can be created (FIGS. 3A and 3B). FIG. 3A shows a resultant low sigma linear vertical polarization pattern 300A created by polarization pattern assembly 100 when panes 102, 102' are illuminated with an incident light beam 210 that is linearly polarized in a horizontal direction. Pattern 300A includes a center zone 310A surrounded by a concentric outer zone 320A. Light in center zone 310A has passed through polarization panes 102, 102' and is now vertically polarized. Light is not present in outer zone 320A due to beam shaper 250. Beam shaper 250 can be a mask having a concentric circle shape that occludes light in zone 320A. Alternatively, beam shaper 250 can be diffractive optics or other types of optical components that direct incident light only to panes 102, 102' in zone 310A. Beam shaper 250 can even be omitted if an incident beam size is narrow enough to impinge only on panes 102, 102'.

Similarly, FIG. 3B shows a resultant low sigma linear horizontal polarization pattern 300B created by polarization pattern assembly 100 when panes 102, 102' are illuminated with an incident light beam 210 that is linearly polarized in a vertical direction. Pattern 300B includes a center zone 310B surrounded by a concentric outer zone 320B. Light in center zone 310B has passed through polarization panes 102, 102' and is now horizontally polarized. Light is not present in outer zone 320B due to beam shaper 250 or beam size as described above with respect to FIG. 3A.

In this way, an advantage of polarization pattern assembly 100 is that either low sigma linear polarization patterns (horizontal or vertical) can be attained simply by inputting horizontally or vertically polarized light.

Figure 4A:
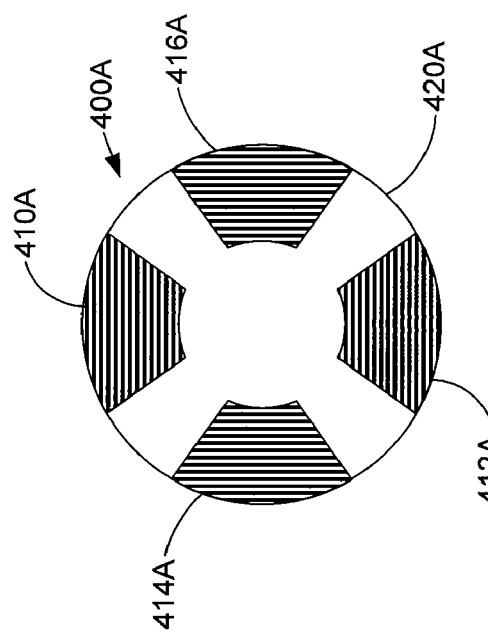
Figure 4B:
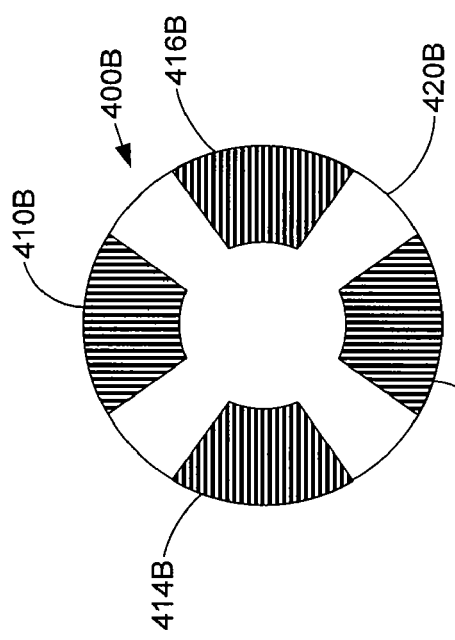

Tangential and radial quadrupole polarization patterns can be created (FIGS. 4A and 4B). FIG. 4A shows a resultant tangential quadrupole polarization pattern 400A created by polarization pattern assembly 100 and beam shaper 250 when illuminated with an incident light beam 210 that is linearly polarized in a horizontal direction. Pattern 400A includes four pole regions 410A, 412A, 414A, and 416A having tangential polarized light. Pole regions 410A, 412A, 414A, and 416A can be formed around an outer peripheral zone of a pupil by beam shaper 250. Light in pole regions 414A, 416A has passed through polarization panes 102, 102' and is now vertically polarized. Light in pole region 410A has passed through non-polarization panes 106, 106' and remains horizontally polarized. Light in pole region 412A has passed through non-polarization panes 104, 104' and also remains horizontally polarized. Light is not present in a spoke wheel shape zone 420A. Beam shaper 250 can be a mask having a spoke wheel shape that occludes light in zone 420A. Alternatively, beam shaper 250 can be diffractive optics or other types of optical components that direct incident light only to regions of polarization pattern assembly 100 corresponding to pole regions 410A, 412A, 414A, and 416A.

FIG. 4B shows a resultant radial quadrupole polarization pattern 400B created by polarization pattern assembly 100 and beam shaper 250 when illuminated with an incident light beam 210 that is linearly polarized in a vertical direction. Pattern 400B includes four pole regions 41GB, 412B, 414B, and 416B having radial polarized light. Pole regions 410B, 412B, 414B, and 416B can be formed around an outer peripheral zone of a pupil by beam shaper 250. Light in pole regions 414B, 416B has passed through polarization panes 102, 102' and is now horizontally polarized. Light in pole region 410B has passed through non-polarization panes 106, 106' and remains vertically polarized. Light in pole region 412B has passed through non-polarization panes 104, 104' and also remains vertically polarized. Light is not present in a spoke wheel shape zone 420B. Beam shaper 250 can be a mask having a spoke wheel shape that occludes light in zone 420B. Alternatively, beam shaper 250 can be diffractive optics or other types of optical components that direct incident light only to regions of polarization pattern assembly 100 corresponding to pole regions 41GB, 412B, 414B, and 416B.

In this way, an advantage of polarization pattern assembly 100 in combination with beam shaper 250 is that tangential and radial quadrupole patterns can be attained simply by inputting horizontally or vertically polarized light.

Figure 5A:
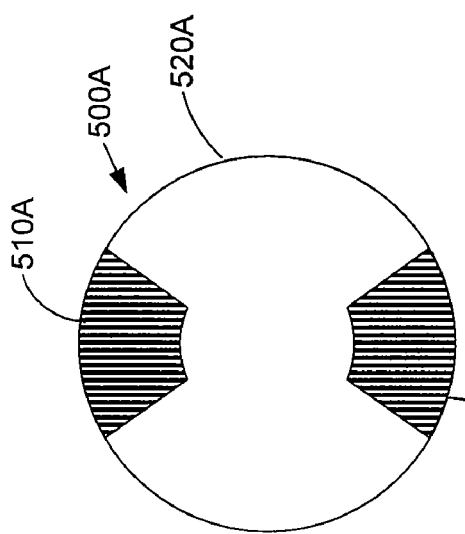
Figure 5B:
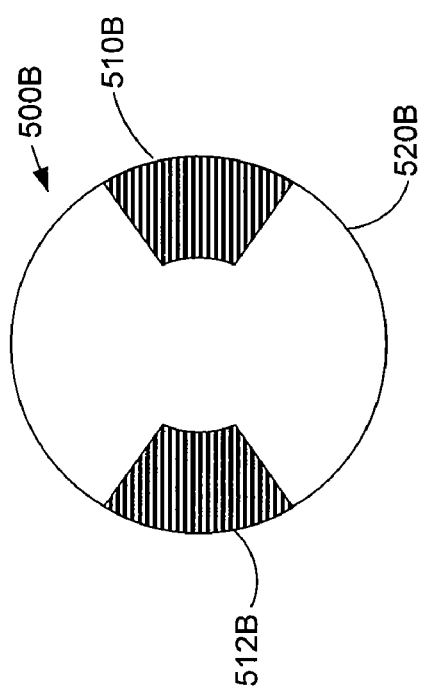

Radial dipole patterns can be created (FIGS. 5A and 5B). FIG. 5A shows a resultant radial dipole polarization pattern 500A created by polarization pattern assembly 100 and beam shaper 250 when illuminated with an incident light beam 210 that is linearly polarized in a vertical direction. Pattern 500A includes two pole regions 510A, 512A having radial polarized light. Pole regions 510A, 512A can be formed around at the top and bottom of an outer peripheral zone of a pupil by beam shaper 250. Light in pole region 510A has passed through non-polarization panes 106, 106' and remains vertically polarized. Light in pole region 512A has passed through non-polarization panes 104, 104' and also remains vertically polarized. Light is not present in a bowtie shape zone 520A. Beam shaper 250 can be a mask having a bowtie shape that occludes light in zone 520A. Alternatively, beam shaper 250 can be diffractive optics or other types of optical components that direct incident light only to regions of polarization pattern assembly 100 corresponding to pole regions 510A, 512A.

FIG. 5B shows a resultant radial dipole polarization pattern 500B created by polarization pattern assembly 100 and beam shaper 250 when illuminated with an incident light beam 210 that is linearly polarized in a vertical direction. Pattern 500B includes two pole regions 510B, 512B having radial polarized light. Pole regions 510B, 512B can be formed around at left and right sides of an outer peripheral zone of a pupil by beam shaper 250. Light in pole regions 510B, 512B has passed through polarization panes 102, 102' and is horizontally polarized. Light is not present in a bowtie shape zone 520B. Beam shaper 250 can be a mask having a bowtie shape that occludes light in zone 520B. Alternatively, beam shaper 250 can be diffractive optics or other types of optical components that direct incident light only to regions of polarization pattern assembly 100 corresponding to pole regions 510B, 512B.

In this way, an advantage of polarization pattern assembly 100 in combination with beam shaper 250 is that radial dipole patterns can be attained simply by inputting vertically polarized light and using beam shaper 250 to direct light to top and bottom regions or left and right side regions. For example, when beam shaper 250 is a bow-tie shaped mask it can simply be rotated to occlude light in zone 520A or 520B.

Figure 6A:
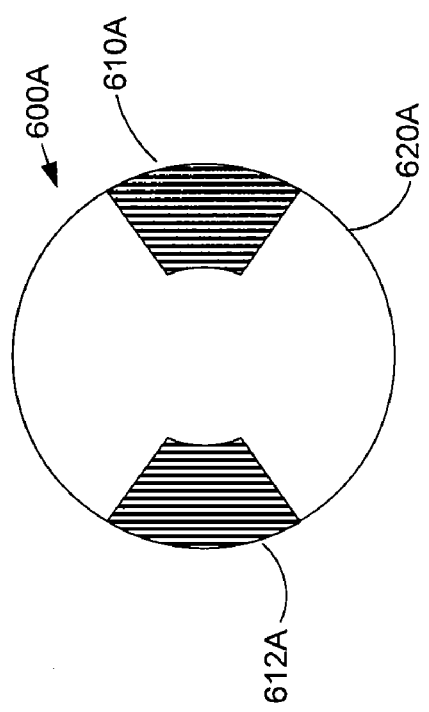
Figure 6B:
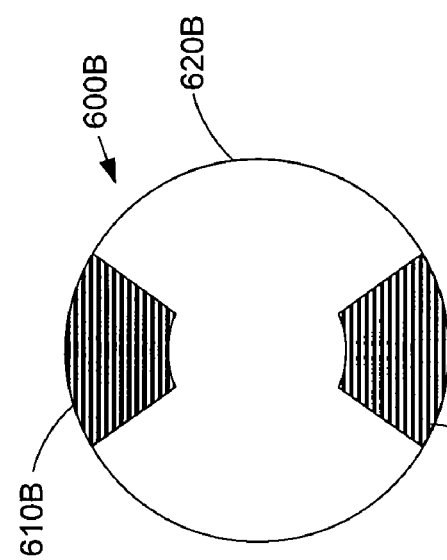

Tangential dipole patterns can be created (FIGS. 6A and 6B). FIG. 6A shows a resultant tangential dipole polarization pattern 600A created by polarization pattern assembly 100 and beam shaper 250 when illuminated with an incident light beam 210 that is linearly polarized in a horizontal direction. Pattern 600A includes two pole regions 610A, 612A having tangential polarized light. Pole regions 610A, 612A can be formed at the left and right of an outer peripheral zone of a pupil by beam shaper 250. Light in pole regions 610A, 612A has passed through polarization panes 102, 102' and is vertically polarized. Light is not present in a bowtie shape zone 620A. Beam shaper 250 can be a mask having a bowtie shape that occludes light in zone 620A. Alternatively, beam shaper 250 can be diffractive optics or other types of optical components that direct incident light only to regions of polarization pattern assembly 100 corresponding to pole regions 610A, 612A.

FIG. 6B shows a resultant tangential dipole polarization pattern 600B created by polarization pattern assembly 100 and beam shaper 250 when illuminated with an incident light beam 210 that is linearly polarized in a horizontal direction. Pattern 600B includes two pole regions 610B, 612B having tangential polarized light. Pole regions 610B, 612B can be formed at a top and bottom of an outer peripheral zone of a pupil by beam shaper 250. Light in pole region 610B has passed through non-polarization panes 106, 106' and remains horizontally polarized. Light in pole region 612B has passed through non-polarization panes 104, 104' and also remains horizontally polarized. Light is not present in a bowtie shape zone 620B. Beam shaper 250 can be a mask having a bowtie shape that occludes light in zone 620B. Alternatively, beam shaper 250 can be diffractive optics or other types of optical components that direct incident light only to regions of polarization pattern assembly 100 corresponding to pole regions 610B, 612B.

In this way, a further advantage of polarization pattern assembly 100 in combination with beam shaper 250 is that tangential dipole patterns can be attained simply by inputting horizontally polarized light and using beam shaper 250 to direct light to top and bottom regions or left and right side regions. For example, when beam shaper 250 is a bow-tie shaped mask it can simply rotated to occlude light in zone 620A or 620B.

FIG. 7 is a diagram illustrating a polarized illuminator 700 including a polarization pattern assembly 100 and/or beam shaper 750 in a lithographic system according to an embodiment of the present invention. Beam shaper 750 and polarization pattern assembly 100 are arranged along a common optical path of illuminator 700. Beam shaper 750 can include first beam shaper element 750A and second beam shaper element 750B disposed on opposite sides of polarization pattern assembly 100 as shown in FIG. 7. In one example, first beam shaper element 750A includes one or more diffractive optics (e.g., diffraction gratings) that diffract light from a light source 702 (e.g., an ultraviolet laser) into two or four diffracted beams corresponding to pole regions around a pupil of illuminator 700. Other optical lenses or components, such as one or more collimating lenses can also be provided to fill a pupil and/or field of illuminator 700 as is well-known in illuminator design. Second beam shaper element 750B can include a mask to further block undesired rays and otherwise clean up the polarization pattern at the pupil.

Polarized illuminator 700 outputs an output beam 705 of polarized illumination to mask 710. Light 715 passing through (or reflected from) mask 710 is projected by an optical system 720 (i.e., projection optics) onto a wafer 730 during printing. This lithography system used with polarized illuminator 700 is illustrative and not intended to limit the present invention. Polarized illuminator 700 can be used in any type of lithographic system or tool as would be apparent to a person skilled in the art given this description.

According to a further feature of the present invention, output beam 705 can have any of a variety of polarization patterns at a pupil of illuminator 700 including, but not limited to, three-zone hybrid polarization patterns, low sigma linear patterns, radial dipole patterns, tangential dipole patterns, tangential quadrupole patterns, and radial quadrupole patterns. Depending upon the configuration of beam shaper 750 and polarization pattern assembly 100, polarized illuminator 700 can provide any of these patterns as described above with respect to FIGS. 2B-6B. Further, polarized illuminator 700 can be switched to provide any of these patterns depending upon the configuration of beam shaper 750 and polarization pattern assembly 100 as described above with respect to FIGS. 2B-6B. For instance, a controller (not shown) can be provided to change the configuration of beam shaper 750 and polarization pattern assembly 100 to obtain a desired pattern. In this way, patterns can be automatically changed during printing to allow different polarization patterns in a pupil during exposure of a wafer. For example, a controller can move one or more diffraction gratings in beam shaper element 750A in and out of the optical path to create two or four diffracted beams (+1, −1 or greater diffracted beam orders) at the pole regions (for dipole or quadrupole patterns), and/or to simply pass a lower order beam for low order sigma linear patterns. Likewise, polarization pattern assembly 100 can be rotated around an optical axis of the optical path so that input linearly polarized light is along a horizontal or vertical direction depending upon the polarization pattern desired. Finally, one or more masks in beam shaper element 750B can also be moved in and out of the optical path through illuminator 700 and rotated so that a mask shape (e.g., a concentric circle, spoke-wheel or bowtie shape) in a desired orientation is present in accordance with the polarization pattern desired.

In certain lithographic applications, the polarization patterns illustrated in FIG. 3 may be advantageous for polarized illuminator 700 to provide. For example, such polarization modes are useful in double exposing the wafer with alternating phase shift masks. Specifically, alternating phase shift masks diffract the light in a different way from binary masks. In the case of alternating phase shift masks, the axial beam of the illuminator is diffracted symmetrically into the projection optics ("PO"). The smallest and sharpest features are achieved with a thin beam of illumination on axis. However, to get the benefit of polarization for several orientations of features at one time, one polarization can be used with a mask that has the vertically oriented structures. The wafer is then exposed again using a second polarization and a second mask with the horizontal structures.

Accordingly, the polarization patterns in FIG. 3 are useful for double exposure with alternating phase shift masks. For example, a mask with mostly vertical lines, i.e., the lines are vertical and repeat horizontally, diffracts mostly horizontally across the PO pupil. These beams recombine at the wafer more effectively if the polarization is vertical. Similarly, a second mask with mostly horizontal structures is imaged better with horizontal polarization. Both masks can be exposed onto the same wafer without "developing the film" in between and the resulting double exposure image is better than if the whole structure had been exposed at once with unpolarized light.

In a further embodiment, the polarization patterns listed in FIG. 4 may be desired in a lithographic application. For example, using a binary mask, the very smallest vertical lines are well imaged by the vertically polarized poles on the right and left edges of the illuminator pupil as shown in FIG. 4A. The +1 and −1 diffraction order from the other two poles are diffracted outside the PO pupil and do not make it to the wafer. Similarly, using a binary mask, the very smallest horizontal lines are well imaged by the horizontally polarized poles on the top and bottom portion of the illuminator pupil as shown in FIG. 4B. The enhancement in the contrast due to the tangential polarization in general more than makes up for the lost contrast due to the non-imaging poles. In this way, all features can be printed in a single exposure where, without polarization control, this would not be possible.

In another embodiment, the polarization patterns listed in FIGS. 5 and 6 are useful for double exposures of mostly horizontal and mostly vertical structures using binary masks. In the case of alternating phase shift masks, double exposures were chosen in order to receive the benefit of polarization. Double exposures are often used because, for a given structure orientation, only two of the four poles produces an image. The other two poles do not. The +1 and −1 diffraction orders are outside the PO pupil. Only the zero order reaches the wafer providing no image and only contributing a contrast robbing constant background.

The present invention is not limited to lithography systems with optical systems producing the patterns of polarization described above or illustrated in the figures. Rather, for any given reticle or mask, there may be an optimal pupil fill and optimal polarization for printing. Accordingly, the present invention encompasses such optimal polarization patterns.

The polarization pane(s) used in the optical systems of the present invention can utilize optics-quality materials that transmit light of a wavelength of interest. Accordingly, the invention is not limited to use with any particular wavelength of light. Example wavelengths are infrared, ultraviolet ("UV"), and visible. In example lithographic applications, the polarization pane(s) can be used with UV illumination, and can be made of quartz, magnesium fluoride or other material or combination of materials transmissive to the illumination beam.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for providing a polarization pattern in a pupil of an illuminator for a lithography system, the method comprising:
   providing a beam shaper and a polarization pattern assembly along a common optical path of the illuminator,
      wherein the beam shaper is configured to pattern radiation incident thereon, and
      wherein the polarization pattern assembly comprises first and second layers spaced apart by a gap, each layer comprising
         a polarization pane configured to change a direction of polarization of radiation incident thereon and
         a non-polarization pane, coplanar with the polarization pane, configured to pass radiation incident thereon without substantially changing the direction of polarization of the incident radiation; and
   illuminating the beam shaper and polarization pattern assembly with a beam of radiation to provide an exposure beam having a polarization pattern in the pupil of the illuminator.

2. The method of claim 1, wherein illuminating the assembly further comprises:
   controlling directions of polarization across the pupil to provide the polarization pattern such that different portions of the exposure beam have different directions of polanzations.

3. The method of claim 1, wherein illuminating the assembly further comprises:
   controlling directions of polarization across the pupil to provide a custom polarization pattern using different directions of polarization.

4. The method of claim 1, wherein the polarization pattern includes a radial polarization pattern.

5. The method of claim 1, wherein the polarization pattern includes a tangential polarization pattern.

6. The method of claim 1, wherein the polarization pattern is from a group comprising a multiple-zone hybrid polarization pattern, a low sigma linear pattern, a radial dipole pattern, a tangential dipole pattern, a tangential quadrupole pattern, and a radial quadrupole pattern.

7. The method of claim 1, wherein the method further comprises:
   coupling a frame to the polarization pattern assembly for supporting the polarization pane.

8. The method of claim 7, wherein the method further comprises:
   supporting the polarization pane in a manner such that the polarization pane is located in a central location with respect to the frame.

9. The method of claim 8, wherein the method further comprises:
   supporting first and second non-polarization panes on opposing sides of the polarization pane, wherein the first and second non-polarization panes are provided along a longitudinal direction perpendicular to an optical axis.

10. The method of claim 8, wherein coupling the frame further comprises:
    providing a spacer in the frame to separate the first layer and the second layer of the polarization pattern assembly by the gap in a stack arrangement.

11. The method of claim 1, further comprising:
    forming a half-wave plate comprising the polarization pane of the first layer of the polarization pattern assembly and the polarization pane of the second layer of the polarization pattern assembly, the half-wave plate being capable of rotating the direction of polarization of radiation incident thereon by about 90 degrees.

12. The method of claim 1, further comprising:
forming a pseudo-zero-order wave plate comprising the polarization pane of the first layer of the polarization pattern assembly and the polarization pane of the second layer of the polarization pattern assembly.

13. The method of claim 1, further comprising:
providing the polarization pattern assembly at or near a pupil plane.

14. The method of claim 1, further comprising:
providing the polarization pattern assembly in a desired pupil space within the illuminator.

15. The method of claim 1,
wherein the beam shaper comprises at least one of a diffractive optical element or mask.

16. The method of claim 15, further comprising:
positioning the beam shaper before the polarization pattern assembly.

17. The method of claim 15, further comprising:
positioning the beam shaper after the polarization pattern assembly.

18. The method of claim 1, further comprising:
rotating the polarization pattern assembly relative to an incident beam to obtain a desired polarization pattern.

19. The method of claim 1, further comprising:
rotating a direction of polarization of an incident beam to obtain a desired polarization pattern.

20. The method of claim 1, further comprising:
rotating the beam shaper with respect to the polarization pattern assembly to obtain a desired polarization pattern.

21. A method for providing different polarization patterns in a pupil of an illuminator for a lithography system, the method comprising:
coupling a frame to an assembly for supporting two layers of panes in a central region of the frame, the two layers of panes separated by a gap in a stack arrangement, wherein each layer of panes includes a polarization pane and two non-polarization panes on opposing sides of the polarization pane;
enabling one or each polarization pane to change a direction of polarization of light incident upon the polarization pane; and
illuminating the assembly with linearly polarized light to selectively generate a desired polarization pattern in the pupil of the illuminator, wherein the generated polarization pattern is configured to provide either a radial polarization pattern or a tangential polarization pattern from a single device.

22. The method of claim 21, further comprising:
causing the polarization pane in each layer of panes in the central region to form a half wave plate that is capable of rotating the polarization direction of an incident beam about 90 degrees.

* * * * *